United States Patent [19]

Johnson

[11] 3,980,154

[45] Sept. 14, 1976

[54] CABINET FOR IMPROVING THE SOUND OUTPUT OF AN AMPLIFIER

[76] Inventor: Rubein V. Johnson, 2432 Court St., Muskogee, Okla. 74401

[22] Filed: Sept. 26, 1975

[21] Appl. No.: 617,046

[52] U.S. Cl. .................. 181/199; 181/148; 181/155; 181/156; 181/160

[51] Int. Cl.² .................. G10K 13/00; H05K 5/00

[58] Field of Search .................. 181/144–160, 181/182, 199

[56] References Cited

UNITED STATES PATENTS

| | | | |
|---|---|---|---|
| 2,811,215 | 10/1957 | Rudd et al. | 181/154 |
| 3,777,844 | 12/1973 | Johnson | 181/199 |

*Primary Examiner*—Stephen J. Tomsky
*Attorney, Agent, or Firm*—Head, Johnson & Chafin

[57] ABSTRACT

A cabinet for improving the sound output of an amplifier including an upright housing having a horizontal partition dividing the interior of the housing into an upper portion and a lower portion, a speaker mounted in the horizontal partition and oriented for directing sound into the upper portion of the housing, a reflective sounding board positioned within the upper portion of the housing inclined at an angle relative to the horizontal partition, the sounding board being inclined from the lower back to the upper front of the housing dividing the upper portion into a forward and rearward resonance chamber, the sounding board reflecting sound outwardly from the cabinet, the sounding board having an opening therein of an area of one-half to seven-eighths of the vibrational area of the speaker, the opening being covered by a metal plate permitting fast sound transmission between the forward and rearward resonance chambers and a front panel covering the housing upper and lower portion, the upper portion of the front panel having a plurality of openings therein through which both direct and reflected sound emanates from the cabinet.

7 Claims, 3 Drawing Figures

CABINET FOR IMPROVING THE SOUND OUTPUT OF AN AMPLIFIER

BACKGROUND AND OBJECTS OF THE INVENTION

This invention is directed to a cabinet for mounting a speaker therein to improve the sound output of an amplifier. For a general discussion of a speaker cabinet of this type, reference may be had to U.S. Pat. No. 3,777,844 issued Oct. 24, 1972 and entitled "ADJUSTABLE SPEAKER CABINET." Speakers for the conversion of electrical signals to sound waves typically employ a coil which is subjected to the electrical signals, the coil being positioned in a magnetic field. Attached to the coil is a conical diaphragm which is vibrated by the coil in response to the electrical signals. The diaphragm vibrations produce sound waves which are responsive to the electrical signals. The compression and rarefaction waves characterized by the sound produced by the speaker can easily "short-circuit" around the speaker from the front to the back. In order to improve the sound reproduction capability of the speaker cabinet arrangements have been suggested, including the cabinet specified in the above-identified previously issued patent.

The present invention is directed towards a highly improved cabinet in which a speaker is mounted to produce sound waves which are more faithfully responsive to the electrical signals which are delivered to the speaker.

It is therefore an object of this invention to provide a cabinet for improving the sound output of an amplifier.

More particularly, an object of this invention is to provide a cabinet in which a speaker is mounted having means for connection to an amplifier and including two completely separate resonance chambers separated by an inclined sounding board, the sounding board having both high and low speed of sound transmission areas for providing improved sound output through the front and the rear of the cabinet.

These general objects, as well as other and more specific objects of the invention will be fulfilled in the following description and claims, taken in conjunction with the attached drawings.

DESCRIPTION OF THE VIEWS

SUMMARY OF THE INVENTION

The invention disclosed herein is a cabinet for improving the sound output of an amplifier including an upright housing having a front and a rear, a horizontal partition dividing the interior of the housing into an upper portion and a lower portion, a speaker mounted in the horizontal partition, the speaker being mounted for upper projection of sound into the housing upper portion, the speaker having means for connection to the output of an amplifier, a sound board positioned within the housing upper portion and inclined at an angle of from about 30 to about 70 degrees relative to the horizontal partition, the sounding board being inclined from the lower rearward end of the horizontal partition to the upper front of the housing to thereby direct sound out the upper front of the housing, the sounding board dividing the upper portion of the housing into a forward resonance chamber and a rearward resonance chamber, and the sounding board having an opening therein and a sheet of metal affixed to the sounding board covering the opening so that the sounding board is formed of a first material having a low rate of sound transmission and the metal sheet having a high rate of sound transmission between the forward and rearward resonance chambers to thereby alter and improve the sound passing out of the housing first resonance chamber through the front of the housing.

DETAILED DESCRIPTION

Figure 1:
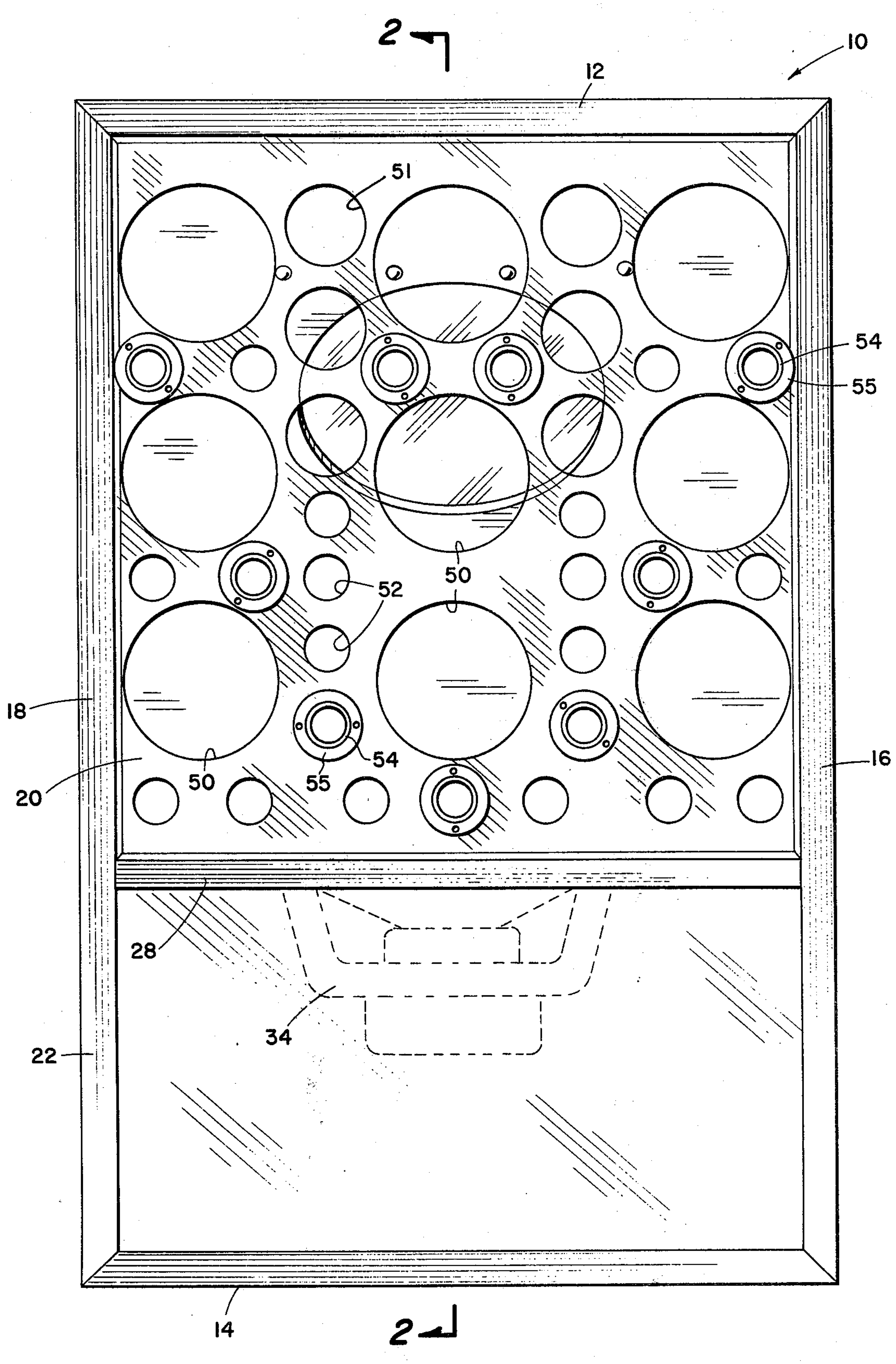
FIG. 1 is an elevational view of the front of a cabinet for improving the sound output of an amplifier incorporating the principles of this invention.
Figure 2:
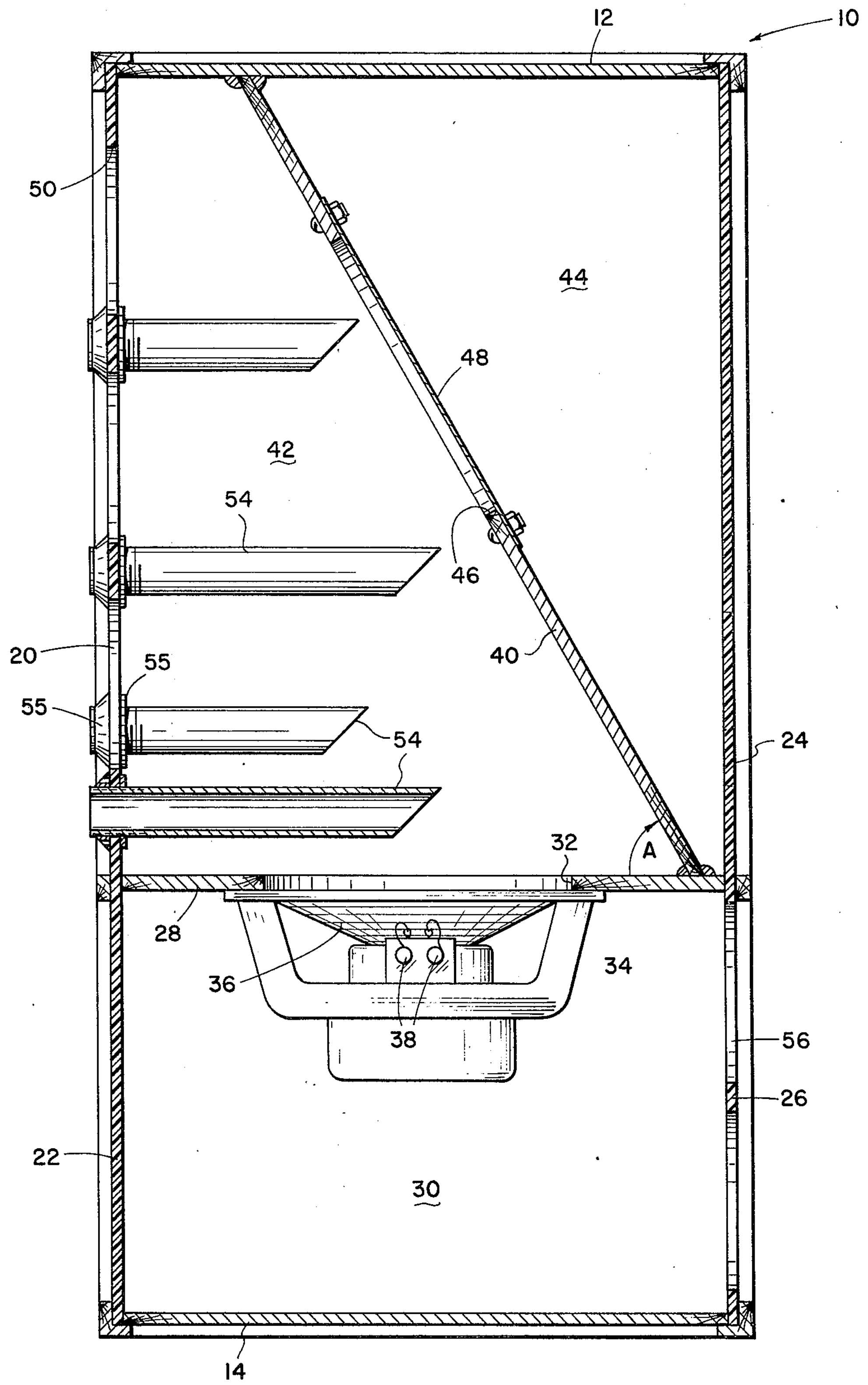
FIG. 2 is a cross-sectional view taken along the line 2—2 of FIG. 1.

Referring to the drawings and first to FIG. 1, an embodiment of the invention is illustrated. A housing of generally upright rectangular configuration is indicated generally by the numeral 10. The housing includes a top 12, a bottom 14, sides 16 and 18, a front panel upper portion 20 and a front panel lower portion 22. More details of the cabinet may be seen in FIG. 2. The cabinet has a rear panel upper portion 24 and a rear panel lower portion 26.

A horizontal partition 28 divides the housing 10 into an upper portion and an interior lower portion 30. The horizontal partition 28 has an opening 32 therein and mounted to the bottom of the horizontal partition is a speaker 34 which closes the opening 32. The speaker 34 has a conical baffle 36 which is resonated as the speaker is energized by means of an amplifier, the baffle 36 having a preselected area which may also be termed the speaker vibrational area. Wires 38 provide means of connecting the speaker 34 to an amplifier (not shown).

Above the horizontal partition 28 the interior of the housing includes an inclined reflective sounding board 40. The sounding board extends from the lower rearward part of the upper interior portion of the housing to the upper front portion and divides the portion of the housing above the horizontal partition into a first resonance chamber 42 and a second resonance chamber 44. The sounding board 40 is inclined relative to the horizontal partition 28 at an angle from about 30° to about 70°. The sounding board has an opening 46 therein. The opening 46 is covered by a sheet of metal 48 of thickness of about 20/thousandth to 60/thousandth inch, with a thickness of about 35 to 40/thousandth inch being preferred. The area of opening 46 which is covered by metal plate 48 is from about one-half to seven-eighths of the vibrational area of speaker 34 with an area about five-eighths of the vibrational area of the speaker being preferred.

The front panel upper portion (see FIG. 1) has a plurality of openings therein including large diameter openings 50, intermediate diameter portions 51, and small diameter openings 52. The total area of the openings 50, 51 and 52 in the upper front panel 20 is preferably at least twice the vibrational area of speaker 34.

The openings 50, 51 and 52 in the front panel provides areas for the emanation of sound from first resonance chamber 42. The sound is reflected from the speaker 34 by sounding board 40, and as will be pointed out subsequently, includes both reflected and re-reflected sounds from the speaker.

Positioned in selected small openings 52 in front panel 20 are a plurality of wave guides 54. Each of the wave guides 54 is a tube of approximately one inch in diameter and of different selected lengths. Each of the wave guides acts to resonate with a selected frequency component of the audio signal from speaker 34. By selecting the number and length of wave guides the user of the speaker can select those frequencies most desirable to him in such a way that the cabinet may be custom tuned to the ear and preference of the individual user of the cabinet.

Figure 3:
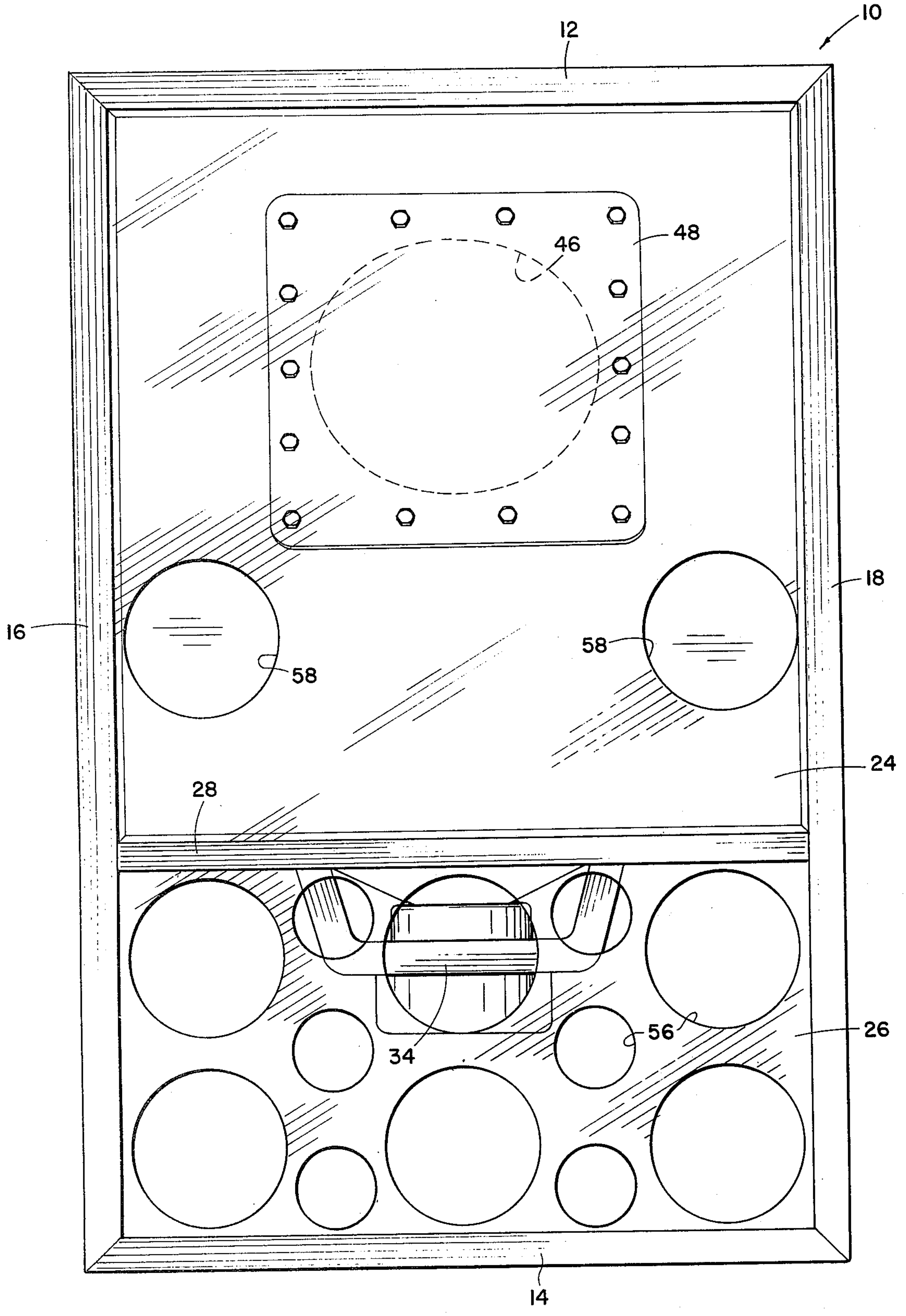
FIG. 3 is an elevational rear view of the speaker shown in FIGS. 1 and 2.

The lower rear panel 26 has a plurality of openings 56 (see FIG. 3), the total area of which is preferably at least equal to the vibrational area of speaker 34. The rear panel upper portion 24 has openings 58, the total area of which is preferably equal to or less than the vibrational area of speaker 34.

The sides 16 and 18 and the top 12 and bottom 14 of the cabinet are preferably formed of relatively heavy wood, such as ¾ inch plywood. The front panels 20 and 22 and rear panels 24 and 26 may be formed of plywood, or as illustrated, of plastic sheet. Plastic or plywood of approximately ¼ inch thickness is desired. The front lower panel 22 is shown of plastic but has been made opaque to conceal the speaker 34 from view through the front panel.

The cabinet described may be used for monaural and stereo phonograph or tape driven amplifiers, radios or television sets or any other system including an amplifier for sound production, including stereo and quadraphonic reproduction of sound. The cabinet may be of any size or shape as long as the basic principles and relationship of sizes, particularly related to the vibrational area of the speaker, are observed. The cabinet may be made of wood, metal or plastic material. While one speaker 34 is shown it can be seen that if desired a plurality of speakers may be employed. In addition, speakers having different sound generating qualities may be selected in varying combinations.

Each sound wave guide tube 54 is provided with screw nuts 55, one on each side of the front panel 20 and by use of a special wrench to tighten up and hold the screw nuts, the sound wave guide tubes may be easily moved from one position to the other as desired by the user.

The forwarding reflecting sound board 40 completely separates the cabinet interior upper portion into two triangular shaped resonance compartments. As the sound waves are propagated from speaker 34 mounted in the baffle board or horizontal partition 28, the sound waves are directed upward to impinge on the forward reflective slanting sound board 40. The slanted sounding board above the speaker is in position to change the angle of incidence over its entire surface as the sound waves from the speaker vary in different wave lengths. The metal diaphragm 48 allows fast entrance of sound to the rear resonance chamber 44 in excess of 16,000 feet per second, that is, approximately the speed of sound through aluminum metal, as an example, whereas the sound passing through the slanting wood sounding board 40 is only approximately 4,000 feet per second. The metal diaphragm 48, having a greater degree of elasticity permits the sound to impinge upon the air space and the triangular sides of resonance chamber 44 to further reflect and re-reflect sound waves which are transmitted back through the sounding board 40 and diaphragm 44 to pass outwardly to the ear of the listener through the openings in front panel upper portion 20. This fast entrance of sound through the metal diaphragm 44 into the second resonance compartment 44 creates a bombardment of the entire sound field of the rear resonance chamber, to such an extent that within the compartment there is created reflected and re-reflected sound. This resonance which is thereby created in the rearward resonance compartment 44 permits sound to pass out through the rearward openings 58 in the rear upper panel 24, which sound returns to the ear of the listener in phase with the sound emanating from front panelling 20. The only other way the sound from resonance chamber 44 may be returned to the front is back through the metal diaphragm 48. As the sound waves re-enter through metal diaphragm 48 the rarefactions return as condensations thus the metal diaphragm 48 constitutes a vibrating body that generates spherical sound waves composed of "shells" of condensations and rarefactions radiating in all directions setting up lines of wave fronts which fronts and rays are perpendicular to one another and in the same state of vibration or phase of vibration. This creates a brilliance and quality of tone which is superior to that achieved by other known types of speaker cabinets.

While the invention has been described with a certain degree of particularity, it is manifest that many changes may be made in the details of construction and the arrangement of components without departing from the spirit and scope of this disclosure. It is understood that the invention is not limited to the embodiment set forth herein and that in the actual practice of the invention the cabinet may have appearance considerably different from the appearance illustrated in the drawings which form a part of this disclosure without departing from the concepts and principles set forth herein. The invention should not be limited to the embodiment illustrated herein for purposes of exemplification, but should be limited only by the scope of the attached claim or claims, including the full range of equivalency to which each element thereof is entitled.

What is claimed:

1. A cabinet for improving the sound output of an amplifier, comprising:

an upright housing having a front and a rear;

a horizontal partition dividing the interior of the housing into an upper portion and a lower portion, the partition having an opening therein;

a speaker mounted on said horizontal partition and covering said opening therein, the speaker having a vibrational area of preselected size, the speaker being mounted for upward projection of sound through said opening into said housing upper portion, the speaker having means for connecting to the output of an amplifier;

a sounding board positioned within said housing upper portion and inclined at an angle of from about 30° to about 70° relative to said horizontal partition, the sounding board being inclined from the housing rear upwardly toward the housing front, the sounding board having an opening therein of an area approximately one-half to seven-eighths times the vibrational area of said speaker;

a sheet of metal affixed to said sounding board and covering said opening therein; and a front panel covering the housing upper and lower portions, the upper portion having openings therein for the emission of sound, the area of the openings being at least twice the vibrational area of said speaker.

2. A cabinet for improving the sound output of an amplifier according to claim 1 wherein said sounding board is of material having a speed of sound transmission of about 4,000 feet per second and said sheet of metal is of material having speed of sound transmission of about 16,000 feet per second.

3. A cabinet for improving the sound output of an amplifier according to claim 1 including a rear panel covering said cabinet upper and lower portions, said rear panel lower portion having a plurality of openings the area of which are at least equal the vibrational area of said speaker, and the rear panel upper portion having at least one opening therein, the area of which is less than the vibrational area of said speaker.

4. A cabinet for improving the sound output of an amplifier according to claim 1 including a plurality of wave guide tubes of selected lengths inserted into selected ones of said openings in said front panel upper portion.

5. A cabinet for improving the sound output of an amplifier according to claim 4 wherein said wave guide tubes are removable and insertable in said opening in said front panel as desired for tonal change.

6. A cabinet for improving the sound output of an amplifier according to claim 1 in which said sounding board is of plywood of about ⅛ to ⅜ inch thickness and said sheet of metal covering said opening therein is from about 20/thousandth to 60/thousandth inch thickness.

7. A cabinet for improving the sound output of a speaker according to claim 1 wherein said sheet of metal affixed to said sounding board and covering said opening therein is from about 20/thousandth to 60/thousandth inch thickness.

* * * * *